United States Patent
Iwase

(10) Patent No.: US 6,172,418 B1
(45) Date of Patent: Jan. 9, 2001

(54) SEMICONDUCTOR DEVICE AND METHOD FOR FABRICATING THE SAME

(75) Inventor: Kanji Iwase, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/338,171

(22) Filed: Jun. 22, 1999

(30) Foreign Application Priority Data

Jun. 24, 1998 (JP) .................................................. 10-177445

(51) Int. Cl.[7] ........................ H01L 23/485; H01L 23/522
(52) U.S. Cl. .......................................... 257/723; 257/777
(58) Field of Search ................................... 257/723–726, 257/777

(56) References Cited

U.S. PATENT DOCUMENTS

| | | | |
|---|---|---|---|
| 5,448,511 | * 9/1995 | Paurus et al. | 365/52 |
| 5,646,446 | * 7/1997 | Nicewarner, Jr. et al. | 257/723 |
| 6,014,316 | * 1/2000 | Eide | 361/735 |

FOREIGN PATENT DOCUMENTS

| | | |
|---|---|---|
| 61-121449 | 6/1986 | (JP) . |
| 4-329662 | 11/1992 | (JP) . |
| 8-3400021 | 12/1996 | (JP) . |

* cited by examiner

*Primary Examiner*—David Mis
(74) *Attorney, Agent, or Firm*—Scully, Scott, Murphy & Presser

(57) ABSTRACT

In a semiconductor device constructed of bare chips stacked together and improved in reliability in connection and in yield in production, used therein is the wiring built-in insulation film assuming a linearly elongated shape containing a series of, for example, five unit films linearly arranged. Each of the unit films corresponds to each of the chips. The film is bent through an angle of approximately 180 degrees at every unit film alternately to the right and the left in a zigzag manner so that each of the chips is packaged in each of the unit films, whereby all the chips are stacked together in the direction of thickness dimensions of the chips through the film having its end portion fixed to the lowermost one of the chips in a manner such that all the chips are wrapped up in the film to form the semiconductor device.

14 Claims, 14 Drawing Sheets

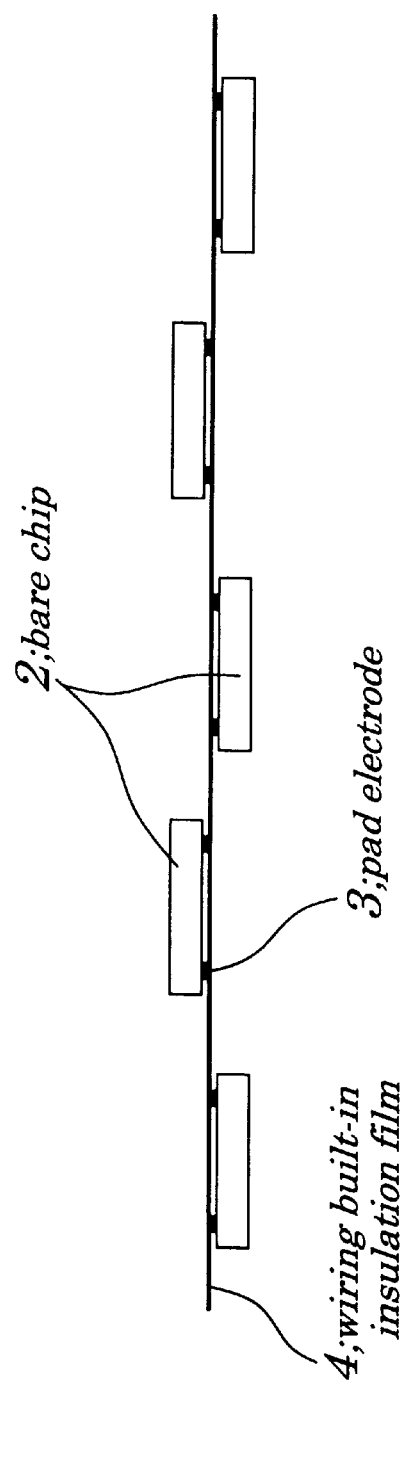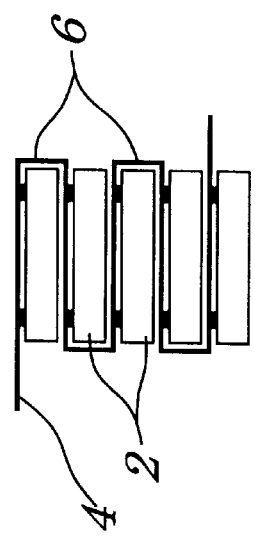
Fig.5 (a)
Fig.5 (b)

SEMICONDUCTOR DEVICE AND METHOD FOR FABRICATING THE SAME

BACKGROUND OF THE INVENTION

1. Field of the Invention

The present invention relates to a semiconductor device and a method for fabricating the semiconductor device, and more particularly to a semiconductor device and a method for fabricating the semiconductor device, wherein the semiconductor device has each of its bare chips packaged in a so-called CSP (i.e., Chip Size Package) which is substantially equivalent in size to the bare chip.

2. Description of the Related Art

Heretofore, it has been known to provide a so-called MCM (i.e., Multi Chip Module) which is used in constructing a small-sized computer system used in processing various types of information, wherein the MCM is produced by connecting a plurality of LSIs (i.e., Large Scale Integrated circuits) such as memories, microprocessors and the like to a common wiring substrate.

It is impossible for the MCM described above to fulfill a need for the MCM to be reduced in size because the MCM has its packaging area size increased due to the presence a number of passive elements such as chips, resistors, chip capacitors and the like which are different from each other in characteristics and function and is two-dimensionally mounted on the wiring substrate.

On the other hand, in recent years, a so-called CSP, i.e., Chip Size Package which is a microstructure package has been developed. This CSP has a construction in which the bare chip is wrapped up in a wiring built-in insulation film so that a package substantially similar in size to the bare chip is constructed.

For example, in Japanese Laid-Open Patent Application No. Hei8-335663 (hereinafter referred to as the prior art document) disclosed therein is a CSP 71 substantially similar to the above-mentioned CSP; as shown in FIG. 18, in this conventional CSP 71, wrapped up in a wiring built-in insulation film 72 is a bare chip 73 with its circuit side 73B down with the exception of a central portion of an upper surface 73A of the bare chip 73, wherein the wiring built-in insulation film 72 is made of polyimide. Further, the central portion of the upper surface 73A of the bare chip 73 is sealed up by means of an insulating resin 74A. On the other hand, the circuit side 73B of the bare chip 73 is bonded to the wiring built-in insulation film 72 by means of another insulating resin 74B.

In addition, a solder ball 75 corresponding to a pad electrode provided in the circuit side 73B of the bare chip 73 is formed in a lower surface of the wiring built-in insulation film 72. This solder ball 75 is used as a connection electrode when the bare chip 73 is connected with the wiring substrate. Further, in a peripheral portion of an upper surface of the wiring built-in insulation film 72, there is formed a test pad 77 corresponding to the pad electrode of the bare chip 73.

This test pad 77 is brought into electric contact with an inspection probe when the bare chip 73 is examined in its characteristics.

Further, as shown in FIG. 19, the prior art document mentioned above discloses a semiconductor device 79 having a construction in which a plurality of, for example, four pieces of the CSPs 71 shown in FIG. 18 are stacked together on the wiring substrate to have their electrodes connected with each other. The above construction is employed to improve the semiconductor device in packaging density by utilizing a space over the conventional semiconductor device as an additional packaging space of the semiconductor device. In a conventional method for fabricating the semiconductor device thus improved in packaging density: the CSP 71 which is wrapped in the wiring built-in insulation film and located in a first layer is connected with the wiring substrate 78 through a heating and melting process; and, each of the remaining three pieces of the CSPs 71, which are located in a second, third and a fourth layer, respectively, is subsequently connected in a manner similar to the above. In another possible conventional method for fabricating the semiconductor device, the four pieces of these CSPs 71 shown in FIG. 19 are previously positioned as a whole, and subjected to the heating and melting process.

However, in the former of the above conventional methods, though there is substantially no problem as to misalignment of the electrodes in connection, it is necessary to perform a plurality of connection operations; the number of which is equal to the number of the CSPs 71 to be connected. Further, in this case, the bare chip 73 is subjected to thermal stress, which often impairs the bare chip 73 in its characteristics. On the other hand, in the latter of the above conventional methods, when a plurality of the CSPs 71 are stacked together to have their electrodes connected with each other and are subjected to a heating and melting process, misalignment of the CSPs 71 occurs together with flattening of a solder bump in a connection portion of a lower one of the CSPs 71, by means of an upper one of the CSPs 71, to cause a short between the electrodes. Occurrence of such a short decreases the semiconductor device in yield in production and reliability in fabrication thereof.

Problems to be solved by the present invention are as follows. Namely, in the conventional semiconductor device described above, when a plurality of the CSPs are stacked together, it is necessary to stack them one by one. This causes connecting conditions of external electrodes of the upper and the lower one of the CSPs with each other to be unstable, and, therefore decreases the conventional semiconductor device in reliability in connection.

In other words, when a plurality of the CSPs are stacked together, it is necessary to perform a packaging operation while the external electrodes of the lower one of the CSPs are connected with the corresponding external electrodes of the upper one of the CSPs. However, when the number of the layers in which the bare chips are located is increased, a positioning or alignment operation of these external electrodes of the upper one and the lower one of the CSPs becomes much more complicated, which makes it difficult to connect the external electrodes to each other without failure.

Further, in view of fabrication of the semiconductor device, stacking these CSPs together is poor not only in packaging efficiency but also in yield in production since the number of necessary process steps increases.

Furthermore, when a plurality of the chips, each of a high integration density and high processing speed type are stacked together in connection into a multi-layer construction, it becomes difficult to disperse the heat generated in each of the thus stacked chips. This considerably increases the temperature of each of the chips to result in a so-called thermal runaway and often in a breakage of each of the chips.

SUMMARY OF THE INVENTION

It is an object of the present invention to provide a semiconductor device and a method for fabricating the semiconductor device, improved in reliability in connection and in yield in production.

In accordance with a first aspect of the present invention, there is provided a semiconductor device having a plurality of its bare chips each with a pad electrode wrapped up in a wiring built-in insulation film with a plurality of external electrodes corresponding to the pad electrodes in a manner such that the pad electrodes of the bare chips are brought into electric contact with the external electrodes of the wiring built-in insulation film, the improvement wherein:

the wiring built-in insulation film assumes a linearly elongated shape containing a series of linearly arranged unit films in each of which each of the bare chips is packaged;

the wiring built-in insulation film is bent through an angle of approximately 180 degrees at every unit film alternately to the right and the left in a zigzag manner;

each of the bare chips is packaged in each of the unit films of the wiring built-in insulation film;

a plurality of the bare chips, which are packaged in the unit films of the wiring built-in insulation film thus bent in the zigzag manner, are then stacked together in the direction of thickness dimensions of the chips; and an end portion of the wiring built-in insulation film is fixed to the lowermost one of the thus stacked bare chips so as to wrap all the bare chips up in the wiring built-in insulation film.

In the foregoing, a preferable mode is one wherein, the wiring built-in insulation film is constructed of a series of the unit films linearly arranged.

Also, in the above-mentioned first aspect, it is a preferable mode that wherein a made-for-short-circuit electrode is provided in a peripheral region of each of the unit films, and the made-for-short-circuit electrode of the unit film is capable of being brought into electric contact with an external electrode through an outer film disposed adjacent to the unit film.

In accordance with a second aspect of the present invention, there is provided a semiconductor device having a plurality of its bare chips each with a pad electrode wrapped up in a wiring built-in insulation film with a plurality of external electrodes corresponding to the pad electrodes in a manner such that the pad electrodes of the bare chips are brought into electric contact with the external electrodes of the wiring built-in insulation film, the improvement wherein:

the wiring built-in insulation film is constructed of a first film and a second film;

the first film assumes a linearly elongated shape containing a series of linearly arranged unit films in each of which each of the bare chips is packaged;

the second film covers the first film;

the first film is bent through an angle of approximately 180 degrees at every unit film;

each of the bare chips is packaged in each of the unit films of the wiring built-in insulation film;

a plurality of the bare chips, which are packaged in the unit films of the first film thus bent, are then stacked together in the direction of thickness dimensions of the bare chips; and an end portion of the second film is fixed to the lowermost one of the thus stacked bare chips so as to wrap all the bare chips up in the wiring built-in insulation film.

In the above-mentioned second aspect, a preferable mode is one wherein the first film continuously extends in two-dimensional directions.

Also, it is a preferable mode that wherein the bare chip is packaged in the second film.

In accordance with a third aspect of the present invention, there is provided a method for fabricating a semiconductor device, comprising the steps of:

forming a wiring built-in insulation film which assumes a linearly elongated shape containing a series of linearly arranged unit films in each of which each of the bare chips is packaged;

packaging each of the bare chips in each of the unit films of the wiring built-in insulation film;

stacking the bare chips together in the direction of thickness dimensions of the bare chips through the wiring built-in insulation film by bending the wiring built-in insulation film through an angle of approximately 180 degrees at every unit film, alternately to the right and the left in a zigzag manner; and wrapping up all the bare chips in the wiring built-in insulation film by fixing an end portion of the wiring built-in insulation film to the lowermost one of the bare chips thus stacked together.

In accordance with a fourth aspect of the present invention, there is provided a method for fabricating a semiconductor device, comprising the steps of:

forming a wiring built-in insulation film constructed of a first film and a second film covering the first film, the first film assuming a linearly elongated shape containing a series of linearly arranged unit films in each of which each of the bare chips is packaged;

packaging each of the bare chips in each of the unit films of the first film of the wiring built-in insulation film;

stacking the bare chips together in the direction of thickness dimensions of the bare chips through the wiring built-in insulation film by bending the first film of the wiring built-in insulation film through an angle of approximately 180 degrees at every unit film alternately to the right and the left in a zigzag manner; and wrapping up all the bare chips in the wiring built-in insulation film by fixing an end portion of the second film of the wiring built-in insulation film to the lowermost one of the bare chips thus stacked together.

As is clear from the above, the following effect of the present invention is obtained. Namely, in the semiconductor device of the present invention and the method of the present invention for fabricating the semiconductor device of the present invention using the wiring built-in insulation film assuming a linearly elongated shape containing a series of linearly arranged unit films in each of which the bare chips is mounted or packaged: the wiring built-in insulation film is bent through an angle of approximately 180 degrees at every unit film, alternately to the right and the left in a zigzag manner; each of the bare chips is mounted or packaged in each of these unit films of the wiring built-in insulation film; a plurality of the bare chips, which are packaged in the unit films of the wiring built-in insulation film thus bent in the zigzag manner, are then stacked together in the direction of thickness dimensions of these chips; and, the end portion of the wiring built-in insulation film is fixed to the lowermost one of the thus stacked bare chips so as to wrap all the bare chips up in the wiring built-in insulation film. Consequently, when the semiconductor device is constructed of the bare chips thus stacked together, it is possible to improve the thus constructed semiconductor device in reliability in connection and in yield in production.

BRIEF DESCRIPTION OF THE DRAWINGS

The above and other objects, advantages and features of the present invention will be more apparent from the following description taken in conjunction with the accompanying drawings in which:

FIG. 5(a) is a plan view of the wiring built-in insulation film still not folded and the bare chips both used in the semiconductor device of the first embodiment of the present invention shown in FIG. 1, illustrating the order of process steps of the method for fabricating the semiconductor device;

FIG. 5(b) is a plan view of the wiring built-in insulation film already folded and the bare chips both used in the semiconductor device of the first embodiment of the present invention shown in FIG. 1, illustrating the order of process steps of the method for fabricating the semiconductor device;

DETAILED DESCRIPTION OF THE PREFERRED EMBODIMENTS

The best modes for carrying out the present invention will be described in detail using embodiments of the present invention with reference to the accompanying drawings.

First Embodiment

Figure 1:
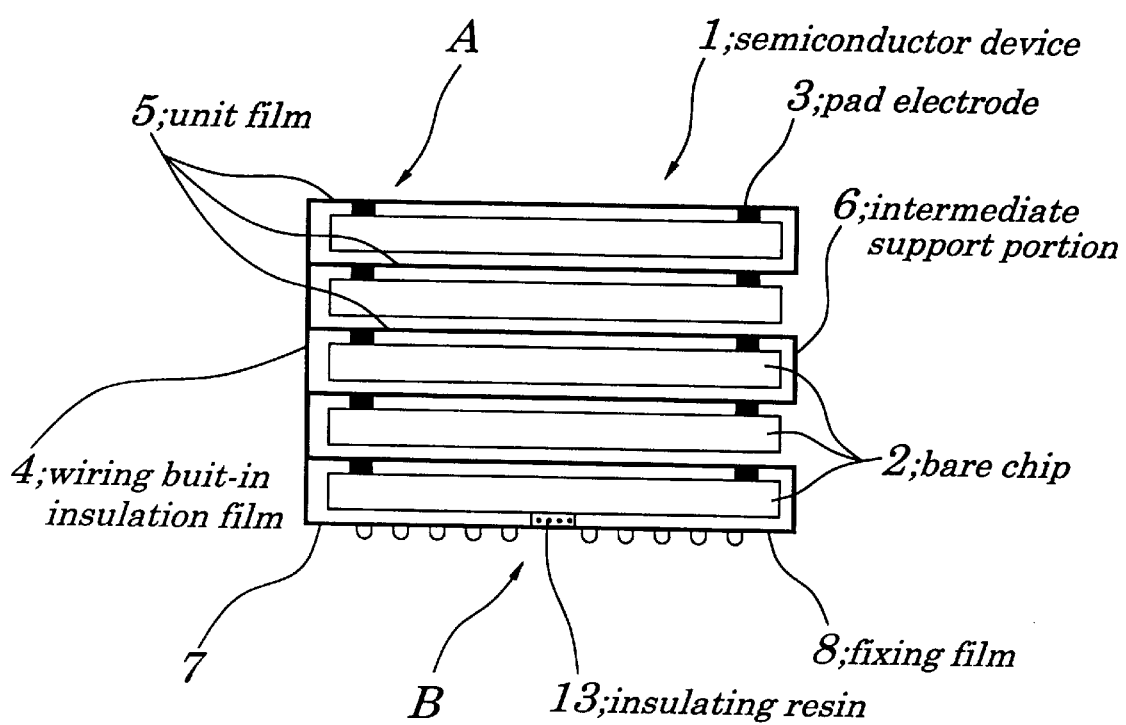
FIG. 1 is a cross-sectional view of a semiconductor device of a first embodiment of the present invention.
Figure 2:
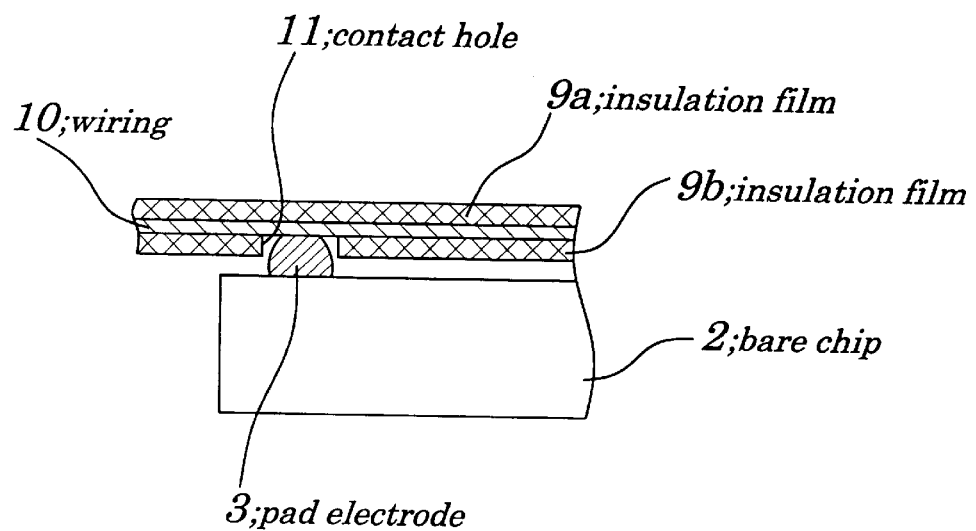
FIG. 2 is a cross-sectional view of an essential part of the semiconductor device of the first embodiment of the present invention shown in FIG. 1.
Figure 3:
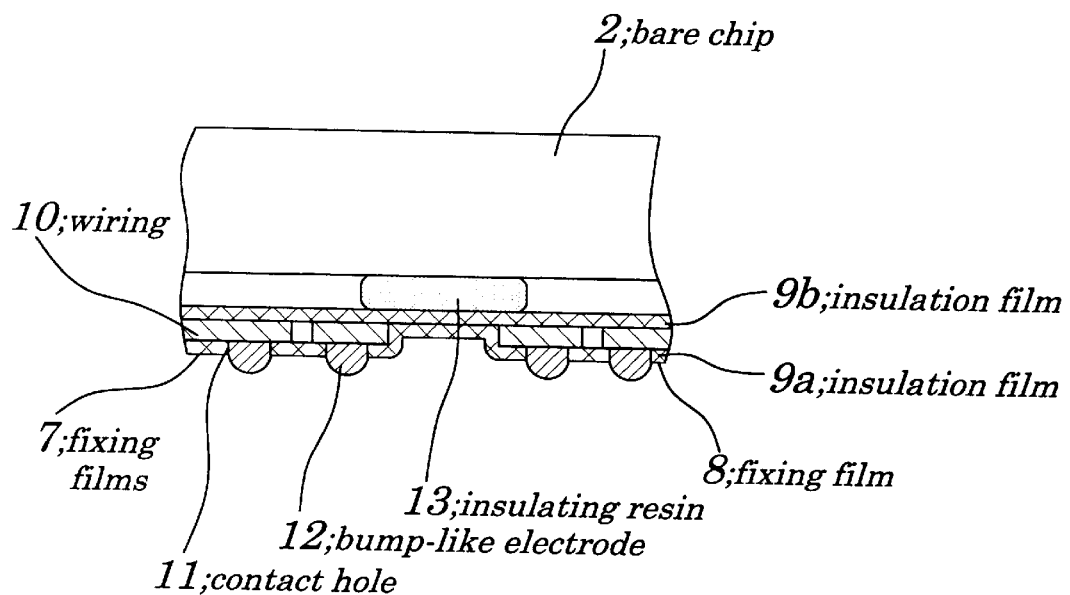
FIG. 3 is a cross-sectional view of another essential part of the semiconductor device of the first embodiment of the present invention shown in FIG. 1.
Figure 4:
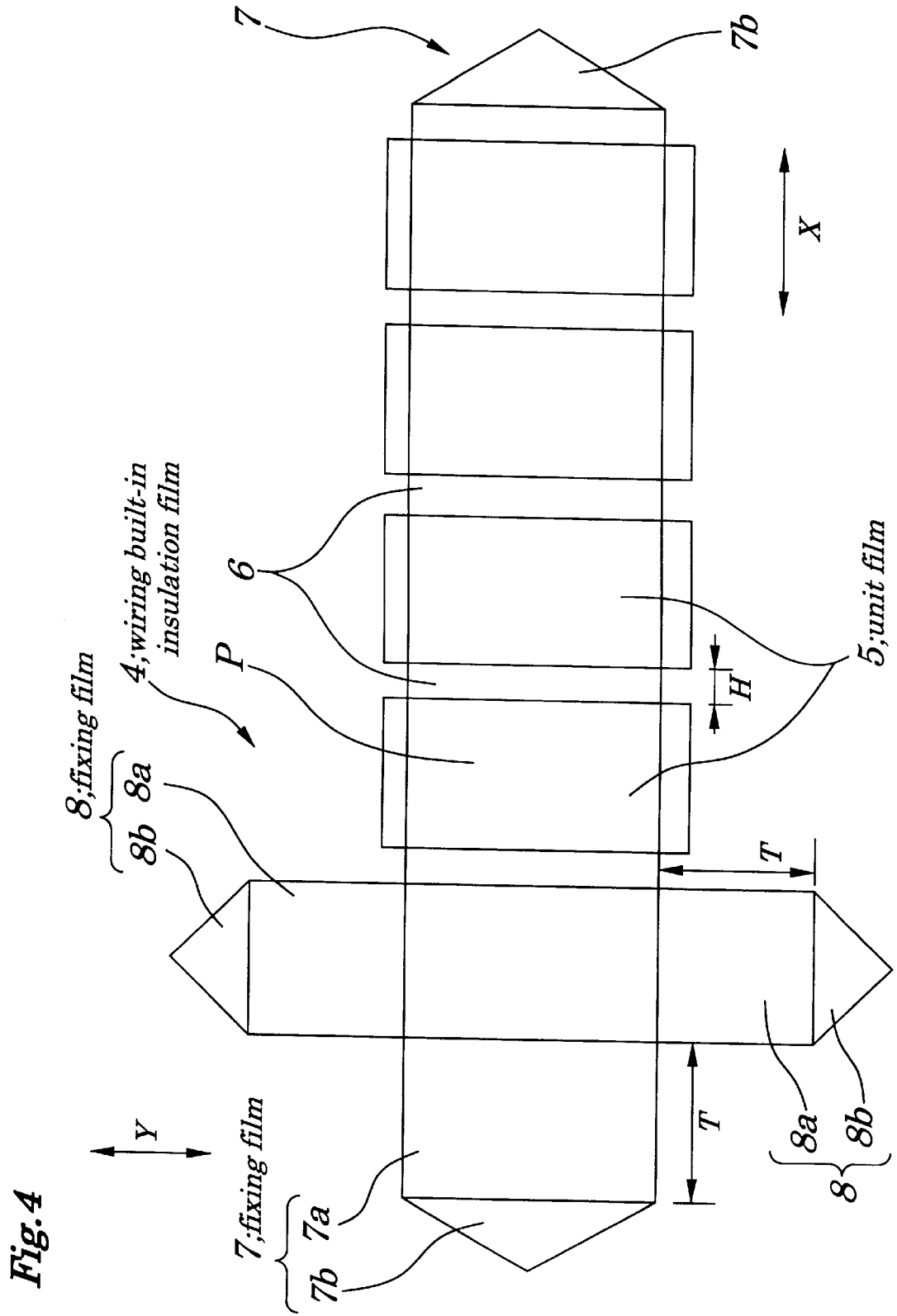
FIG. 4 is a pattern view of the wiring built-in insulation film used in the semiconductor device of the first embodiment of the present invention shown in FIG. 1, illustrating the order of process steps of a method for fabricating the semiconductor device.

FIGS. 1 to 3 show a semiconductor device 1 of a first embodiment of the present invention. More particularly, of the drawings: FIG. 1 is a cross-sectional view of the semiconductor device 1 of the present invention; FIG. 2 is an enlarged view of a portion A of the semiconductor device 1 of the present invention shown in FIG. 1; and, FIG. 3 is an enlarged view of a portion B of the semiconductor device 1 of the present invention. Further, FIGS. 4, 5(a) and 5(b) show a series of process steps of a method of the present invention for fabricating the semiconductor device 1 shown in FIGS. 1 to 3.

In the semiconductor device 1 of this first embodiment, as shown in FIG. 1, a plurality of bare chips 2 each of which is constructed of an LSI chip are stacked together in the direction of thickness dimensions of these chips through a wiring built-in insulation film 4 comprising a plurality of unit films 5, in each of which unit films 5 each of the bare chips 2 is mounted or packaged.

The wiring built-in insulation film 4 assumes a linearly elongated shape containing a series of, for example, five pieces of the unit films 5 linearly arranged, provided that: an intermediate support portion 6 is interposed between adjacent ones of these unit films 5, as shown in FIG. 1; the wiring built-in insulation film 4 is bent through an angle of approximately 180 degrees at every unit film 5 alternately to the right and the left in a zigzag manner; and, each of the bare chips 2 is mounted or packaged in each of these unit films 5 of the wiring built-in insulation film 4. As shown in FIGS. 2 and 3, the wiring built-in insulation film 4 is constructed of: a pair of insulation films 9a, 9b made of polyimide resins; and, a wiring 10 which is made of copper and assumes a desired shape formed through a suitable patterning process.

As is clear from FIGS. 2 and 3, a contact hole 11 is formed in a desired portion of the pair of the insulation films 9a, 9b which form the wiring built-in insulation film 4. Through this contact hole 11, the wiring built-in insulation film 4 has a part of its wiring 10 exposed to the outside. Of these insulation films 9a and 9b, an outer one, 9a, is provided with a bump-like electrode 12 which serves as an external electrode. This bump-like electrode 12 is made of a suitable material such as gold, gold-plated copper, solder, or the like, and brought into electric contact with the wiring 10 through the contact hole 11 of the insulation films 9a, 9b.

On the other hand, as shown in FIG. 2, a pad electrode 3 is formed in a surface of the bare chip 2. This pad electrode 3 is constructed of a ball-like conductive element, which element is made of, for example, materials similar to those used in the bump-like electrode 12 and connected with an aluminum wiring extending from the semiconductor substrate. The bare chip 2 is packaged in the unit film 5 of the wiring built-in insulation film 4 in a manner such that the bare chip 2 has its pad electrode 3 connected with the wiring 10 by a flip chip bonding process through a contact hole 11 of the other insulation film 9b which forms an inner component film of the wiring built-in insulation film 4. Due to this, there is continuity between the pad electrode 3 of the bare chip 2 and the bump-like electrode 12 through the wiring 10, wherein the bump-like electrode 12 forms an external electrode.

A pair of front end portions of the fixing films 7, 8 of the wiring built-in insulation film 4 have their chip sealing portions 7b, 8b fixedly bonded through an insulating resin 13 to the lowermost one of the plurality of the bare chips 2 thus stacked together. As a result, all the bare chips 2 are packaged in the wiring built-in insulation film 4 in a manner such that the bare chips 2 are wrapped in the wiring built-in insulation film 4 to form the semiconductor device 1.

Next, with reference to FIGS. 5(a) and 5(b), a method of the present invention for fabricating the semiconductor device 1 will be described in the order of process steps of the method.

First, as shown in FIG. 4, the wiring built-in insulation film 4 is formed so as to assume a linearly elongated shape containing a series of, for example, five pieces of the unit films 5 linearly arranged therein, provided that:

the intermediate support portion 6 is interposed between adjacent ones of these unit films 5. The wiring built-in insulation film 4 is constructed of:

the pair of the insulation films 9a, 9b made of polyimide resins; and, the wiring 10, which is made of copper, assumes a desired shape formed through a suitable patterning process, and is disposed between the pair of the insulation films 9a, 9b so as to be incorporated in the wiring built-in insulation film 4. The contact hole 11 corresponding to the pad electrode 3 of the bare chip 2 is formed in a position in which an inner surface of each of the unit films 5 forms a packaging or mounting surface for each of the bare chips 2, so that the wiring 10 has its part exposed to the outside through the contact hole 11.

The unit film 5 has its area size P set at a value capable of sufficiently covering the bare chip 2 which should be packaged in the unit film 5. At the same time, a height H of the intermediate support portion 6 is set at a value slightly larger than the thickness of the bare chip 2. On the other hand, a pair of the fixing films 7 are provided in opposite longitudinal end portions of the wiring built-in insulation film 4 which extends outwardly in the direction of its length (hereinafter referred to as the direction X). At the same time, a pair of the remaining fixing films 8 are provided in opposite transverse end portions of the wiring built-in insulation film 4 so as to extend outwardly in the direction of its width (hereinafter referred to as the direction Y) perpendicular to the direction X. Further, one of the fixing films 7 and each of the pair of the fixing films 8 are provided with the chip sealing portions 7b and 8b together with the chip support portions 7a and 8a, respectively, wherein: each of the chip support portions 7a and 8a has a height T which is substantially equal to a height of 5×H, provided that 5 is the number of pieces of the intermediate support portions 6, and H is a height of each of the intermediate support portions 6.

Then, as shown in FIG. 5(a), the bare chips 2 are packaged or mounted in the unit films 5 of the wiring built-in insulation film 4 by the flip chip bonding process, wherein the bare chips 2 are first disposed alternately in the upper and the lower side of the wiring built-in insulation film 4 in a zigzag manner, as viewed in FIG. 5(a). In this case, each of the unit films 5 is disposed so as to correspond to each of the bare chips 2 being packaged, so that the wiring 10 is partially exposed to the outside through the contact hole 11.

Next, as shown in FIG. 5(b), the wiring built-in insulation film 4 is bent in each of its intermediate support portions 6 through an angle of approximately 180 degrees at every unit film 5 alternately to the right and the left in a zigzag manner as viewed in FIG. 5(b), so that five pieces of the bare chips 2 are stacked together. Subsequent to the above, the pair of the fixing films 7 and the pair of the fixing films 8 of the wiring built-in insulation film 4 are bent so as to wrap up each of its bare chips 2. After that, as shown in FIGS. 3 and 4, the chip sealing portions 7b and 8b of the wiring built-in insulation film 4 are fixedly bonded through the insulating resin 13 to the lowermost one of the thus stacked bare chips 2, so that the semiconductor device 1 of this first embodiment of the present invention is fabricated.

In other words, in this first embodiment of the present invention, stacked together are not the CSPs (i.e., chip size packages) in contrast with the prior art. Stacked together in this first embodiment of the present invention are the bare chips 2, which forms the semiconductor device 1.

Figure 6:
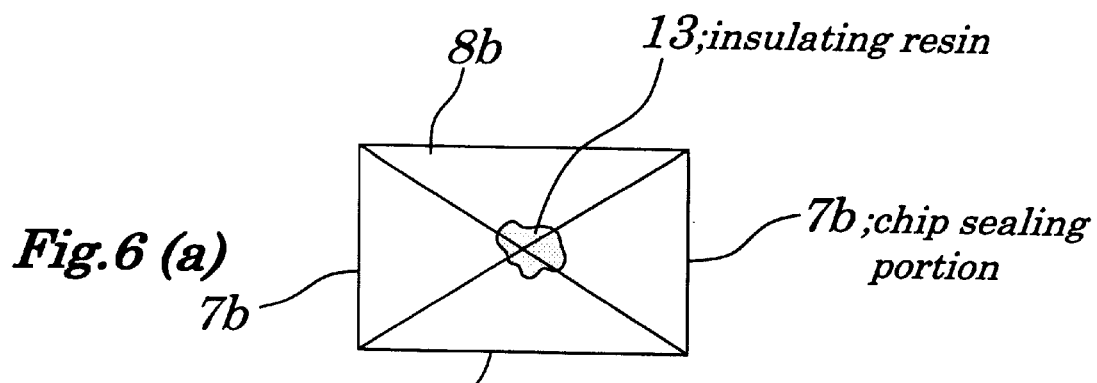
FIG. 6(a) is a bottom view of the wiring built-in insulation film of the semiconductor device of the first embodiment of the present invention shown in FIG. 1, illustrating the random pattern of the insulating resin after the wiring built-in insulation film is folded.
FIG. 6(b) is a bottom view of the wiring built-in insulation film of the semiconductor device of the first embodiment of the present invention shown in FIG. 1, illustrating the rectangular pattern of the insulating resin after the wiring built-in insulation film is folded.
FIG. 6(c) is a bottom view of the wiring built-in insulation film of the semiconductor device of the first embodiment of the present invention shown in FIG. 1, illustrating the cross pattern of the insulating resin after the wiring built-in insulation film is folded.
Figure 6:
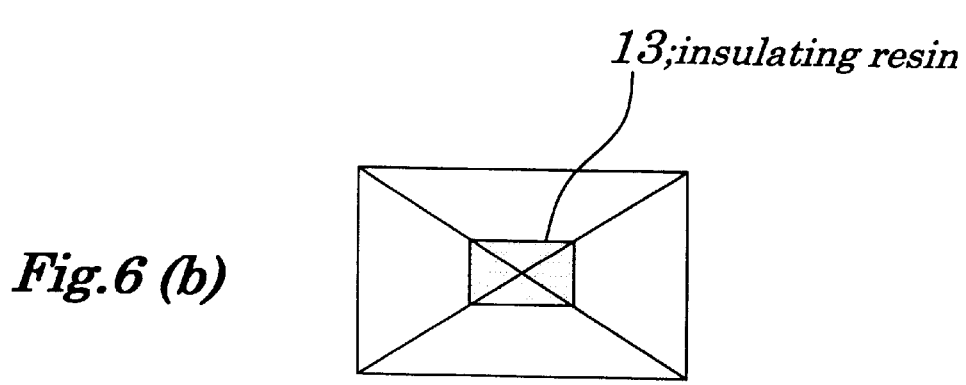
Figure 6:
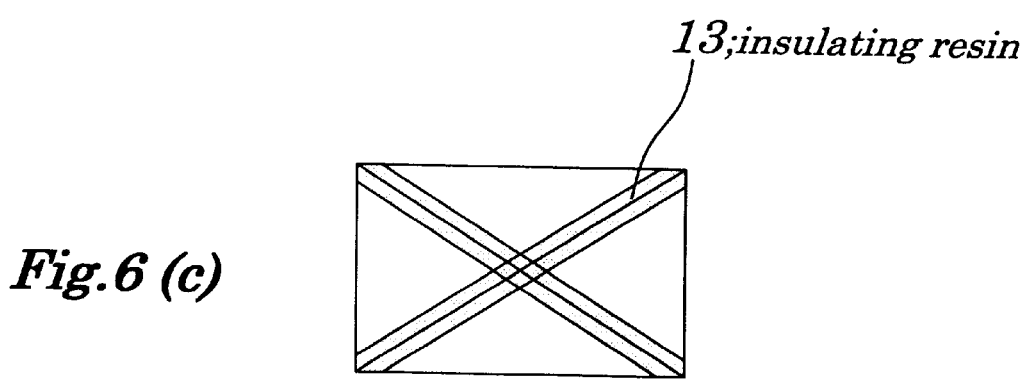

FIGS. 6(a), 6(b) and 6(c) show an example of how the wiring built-in insulation film 4 is fixed by means of the insulating resin 13, wherein: FIG. 6(a) shows an example of how the insulating resin 13 is applied to the front end portions of the chip sealing portions 7b and 8b of the wring built-in insulation film 4; FIG. 6(b) shows an example of how the insulating resin 13 is applied to the restricted regions in the front end portions of the chip sealing portions 7b and 8b of the wiring built-in insulation film 4; and, FIG. 6(c) shows an example of how the insulating resin 13 is applied to the wiring built-in insulation film 4 along its chip sealing portions 7b and 8b.

As described above, in the construction of this first embodiment of the present invention:

used therein is the wiring built-in insulation film 4 which assumes the linearly elongated shape containing therein a series of, for example, five pieces of the unit films 5 linearly arranged, each of which films 5 corresponds to each of the bare chips 2; and, the wiring built-in insulation film 4 is bent through an angle of approximately 180 degrees at every unit film 5 alternately to the right and the left in a zigzag manner, as viewed in FIG. 5(b), wherein each of the bare chips 2 is mounted or packaged in each of these unit films 5 of the wiring built-in insulation film 4, so that all the plurality of the bare chips 2 are stacked together in the direction of thickness dimensions of these bare chips 2 through the wiring built-in insulation film 4 which has its end portions fixed to the lowermost one of the bare chips 2 in a manner such that all the bare chips 2 are wrapped in the wiring built-in insulation film 4 to form the semiconductor device 1. Consequently, in fabricating the semiconductor device by stacking a plurality of the bare chips 2 together, the present invention is capable of improving the semiconductor device in reliability in connection and in yield in production.

Therefore, in the present invention, it is possible to form the MCM (i.e., multi chip module) by using a single piece of the semiconductor device in which a plurality of the bare chips are stacked together using spaces arranged in the direction of thickness dimensions of these bare chips.

Further, after the plurality of the bare chips 2 are packaged or mounted in the unit films 5 of the wiring built-in insulation film 4, the wiring built-in insulation film 4 is bent through an angle of approximately 180 degrees at every unit film 5 alternately to the right and the left in a zigzag manner so as to have all the bare chips 2 stacked together through the wiring built-in insulation film 4 in the direction of thickness dimensions of the bare chips 2. Consequently, in the first embodiment of the present invention, it is possible to have the external electrodes connected with each other through the wiring, without failure. Furthermore, with this connection, packaging efficiency is also improved. Further, in the first embodiment of the present invention, since the number of necessary process steps does not increase, it is possible to prevent the yield in production from decreasing.

Second Embodiment

Figure 7:
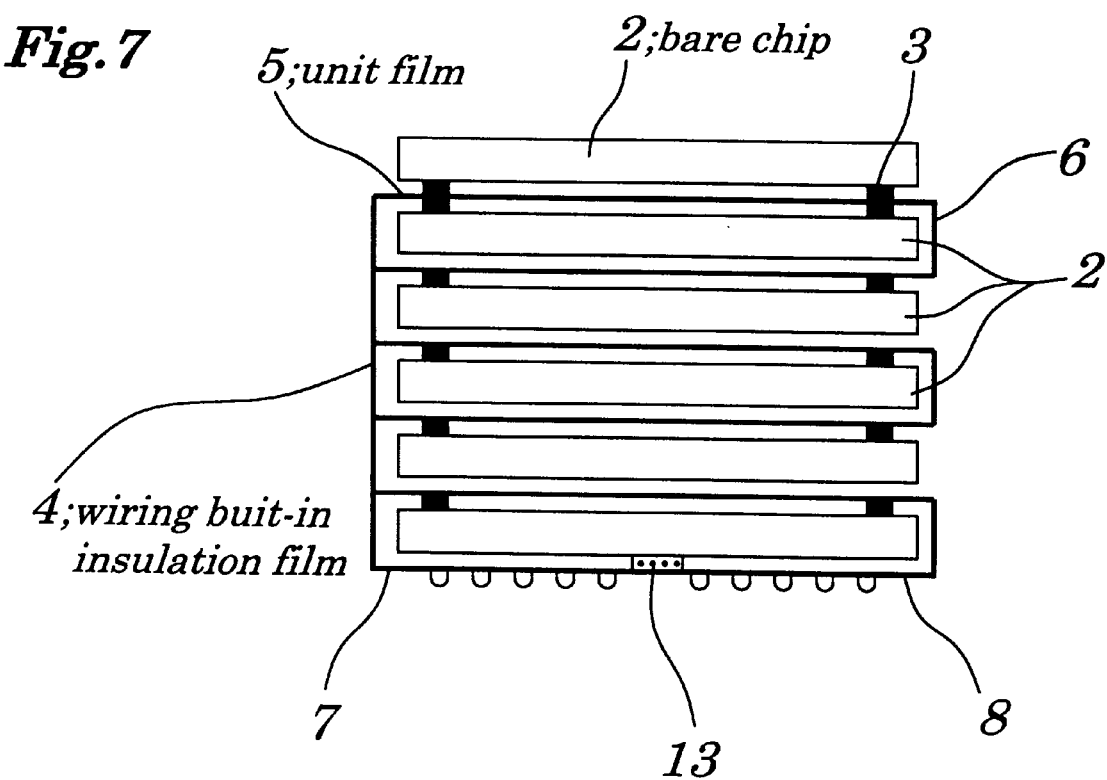
FIG. 7 is a cross-sectional view of the semiconductor device of a second embodiment of the present invention.

FIG. 7 is a cross-sectional view of the semiconductor device of a second embodiment of the present invention. This second embodiment of the present invention considerably differs from the first embodiment of the present invention in that it is provided with an additional bare chip 2 in addition to the semiconductor device of the first embodiment of the present invention.

In other words, as shown in FIG. 7, in the second embodiment of the semiconductor device of the present invention, the additional bare chip 2 described above is packaged or mounted in the uppermost one of the unit films 5 of the wiring built-in insulation film 4. In this case, such uppermost one of the unit films 5 is provided with a through-hole called the contact hole 11 extending from its outer surface to its inner surface, through which contact hole 11 the uppermost one of the unit films 5 has its wiring 10 exposed to the outside as is in the first embodiment of the present invention.

In FIG. 7 showing the second embodiment of the present invention, the remaining parts other than the above additional bare chip 2 are the same as ones of the first embodiment of the present invention, and, therefore have been given the same reference numerals and characters as those used in the first embodiment of the present invention to avoid redundancy in description.

As described in the above, it is also possible for the second embodiment of the present invention to obtain substantially the same effect as that of the first embodiment of the present invention.

In addition, in this second embodiment of the present invention, since it is possible to package or mount the additional bare chip without increasing a two-dimensional packaging space of the semiconductor device, it is possible to provide an additional function in the semiconductor device without increasing its two-dimensional packaging space.

Third Embodiment

Figure 8:
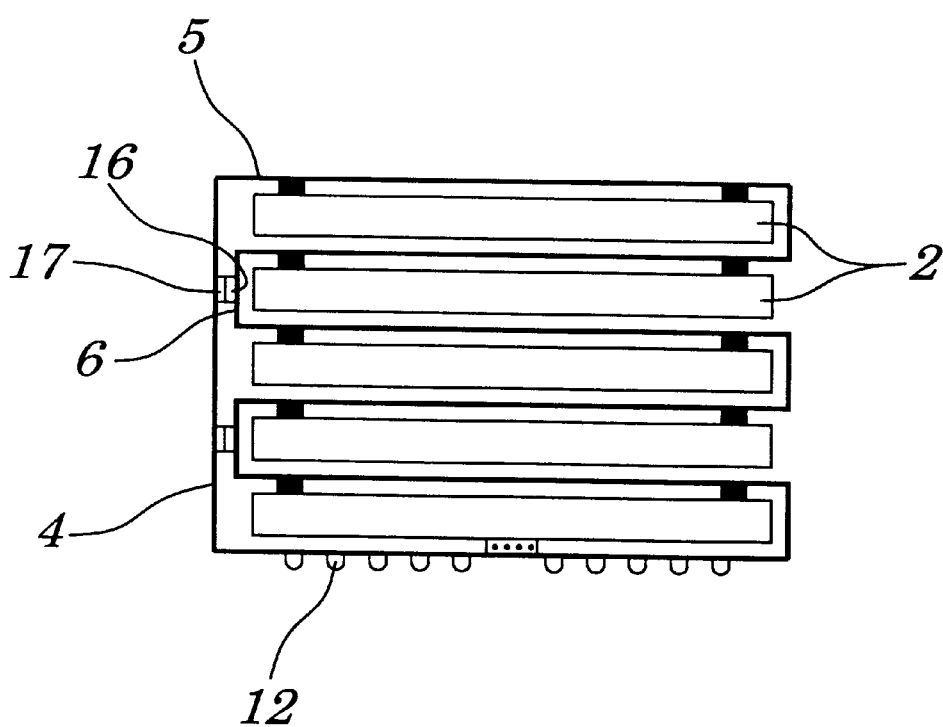
FIG. 8 is a cross-sectional view of the semiconductor device of a third embodiment of the present invention.
Figure 9:
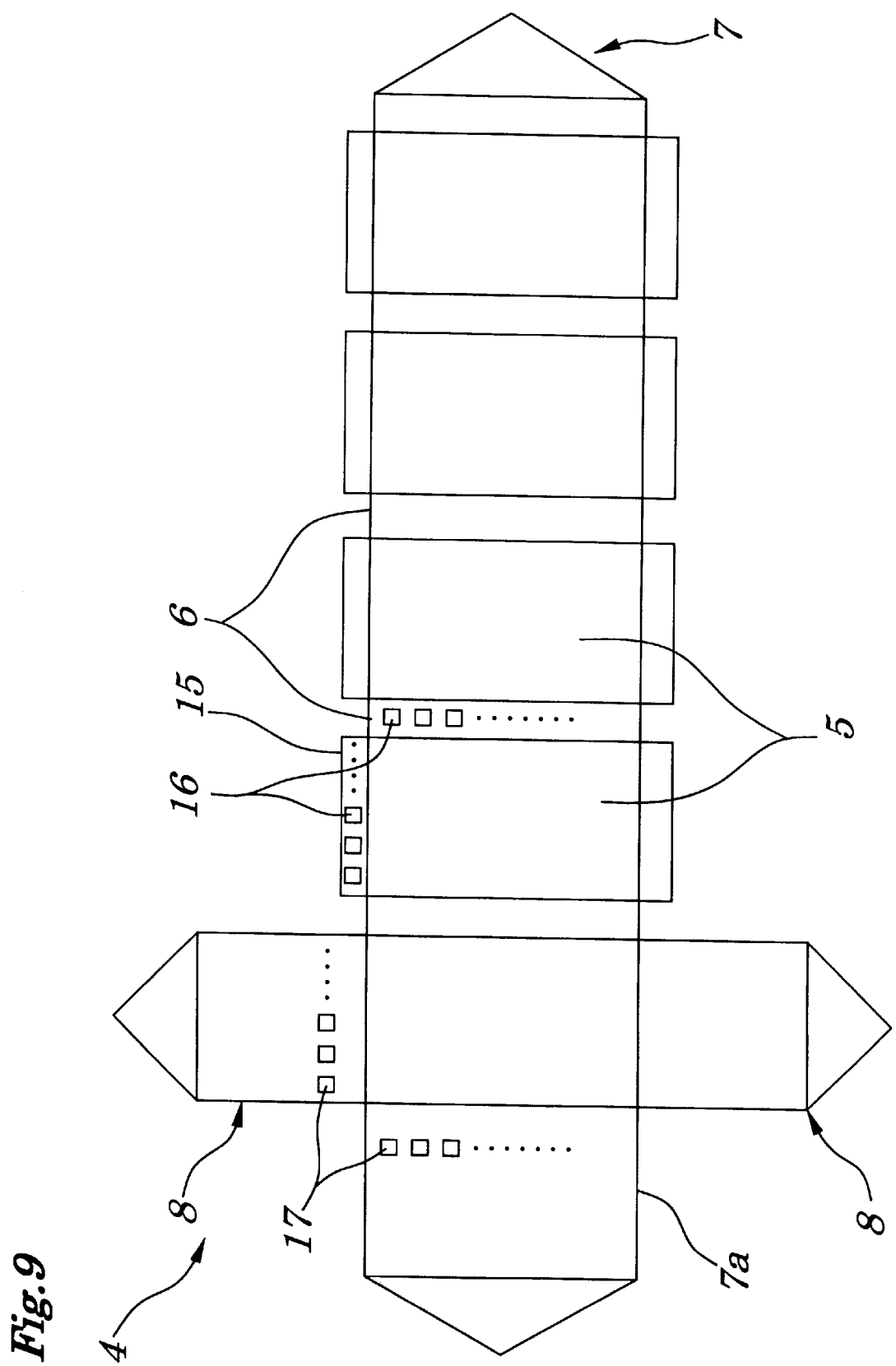
FIG. 9 is a plan view of the wiring built-in insulation film still not folded and is used in the semiconductor device of the second embodiment of the present invention shown in FIG. 7, illustrating the order of process steps of the method for fabricating the semiconductor device.

FIG. 8 shows a cross-sectional view of the semiconductor device of a third embodiment of the present invention. FIG. 9 shows a plan view of the wiring built-in insulation film used in the method for fabricating the semiconductor device of the present invention. This third embodiment of the present invention considerably differs from the first embodiment of the present invention in that:

it is provided with a plurality of made-for-short-circuit electrodes 16 in the peripheral regions of the unit films 5 so as to reduce in impedance both the power supply and the signal lines of the semiconductor device; and, each of these made-for-short-circuit electrodes 16 is capable of being connected with an external electrode through an outer film disposed adjacent to the unit film 5.

In other words, as shown in FIG. 9, in the third embodiment of the semiconductor device of the present invention, among the unit films 5 of the wiring built-in insulation film 4 previously formed, a desired unit film 5 has its peripheral regions such as its intermediate support portions 6 and its side surface portions 15 provided with a plurality of the made-for-short-circuit electrodes 16 for reducing in impedance both the power supply and the signal lines of the semiconductor device. On the other hand, a plurality of outgoing electrodes 17 for the made-for-short-circuit electrodes 16 are disposed in the positions of the chip support portions 7a, 8a of the fixing films 7, 8 so as to be oppositely disposed from the made-for-short-circuit electrodes 16 hen the wiring built-in insulation film 4 is bent in a manner described above.

Due to the above construction, when the semiconductor device of the third embodiment of the present invention is fabricated by bending the wiring built-in insulation film 4, as shown in FIG. 8, the outgoing electrodes 17 for the made-for-short-circuit electrodes 16 are brought into electric contact with the corresponding made-for-short-circuit electrodes 16, and further brought into electric contact with the bump-like electrodes 12 through the wiring 10.

As described in the above, it is also possible for the third embodiment of the present invention to obtain substantially the same effect as that of the first embodiment of the present invention.

In addition, in this third embodiment of the present invention, it is possible to provide the made-for-short-circuit electrodes 16 for reducing in impedance both the power supply and the signal lines of the semiconductor device without increasing a two-dimensional packaging space of the semiconductor device.

Fourth Embodiment

Figure 10:
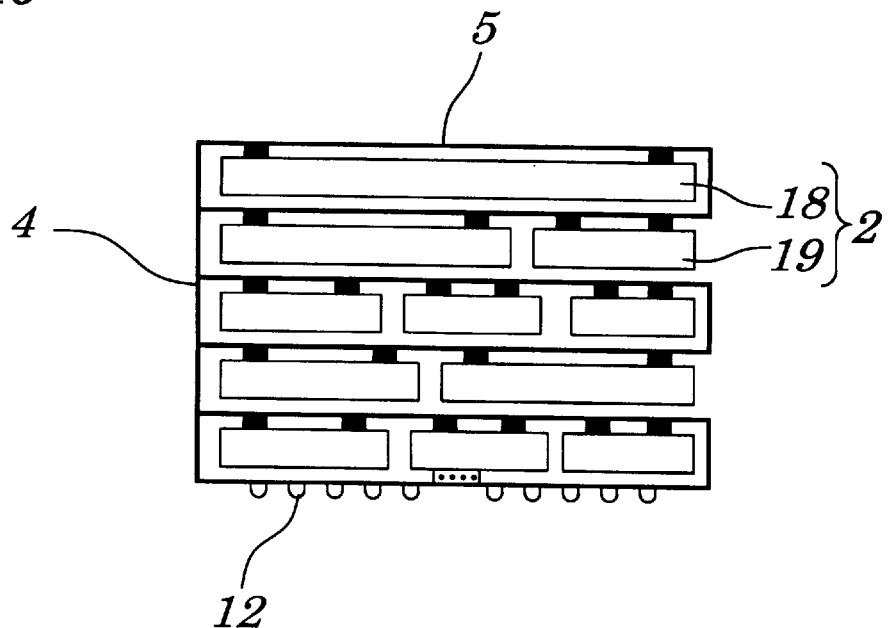
FIG. 10 is a cross-sectional view of the semiconductor device of a fourth embodiment of the present invention.

FIG. 10 is a cross-sectional view of the semiconductor device of a fourth embodiment of the present invention. This fourth embodiment of the present invention considerably differs from the first embodiment of the present invention in that it has its unit films 5 provided for packaging not only an LSI chips 18 but also a passive element chip 19, for example such as resistors, capacitors, inductors and like passive element chips therein.

As described in the above, it is also possible for the fourth embodiment of the present invention to obtain substantially the same effect as that of the first embodiment of the present invention.

In addition, in this fourth embodiment of the present invention, it is possible to package or mount a large number of various types in function of the bare chips 5 in the semiconductor device without increasing a two-dimensional packaging space of the semiconductor device, which enlarges in function the semiconductor device.

Fifth Embodiment

Figure 11:
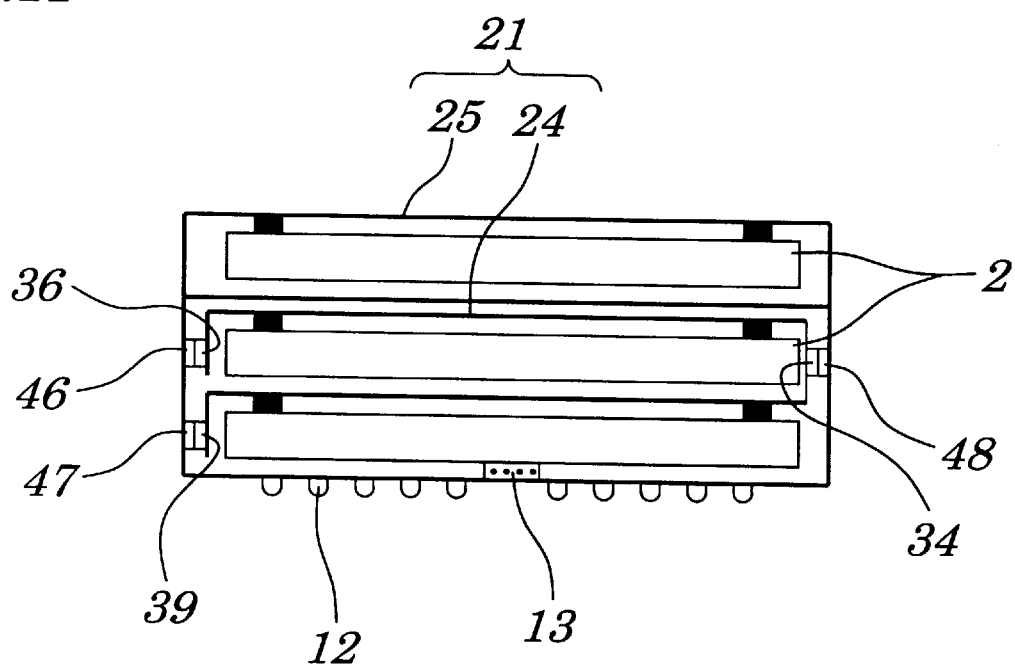
FIG. 11 is a cross-sectional view of the semiconductor device of a fifth embodiment of the present invention.
Figure 12:
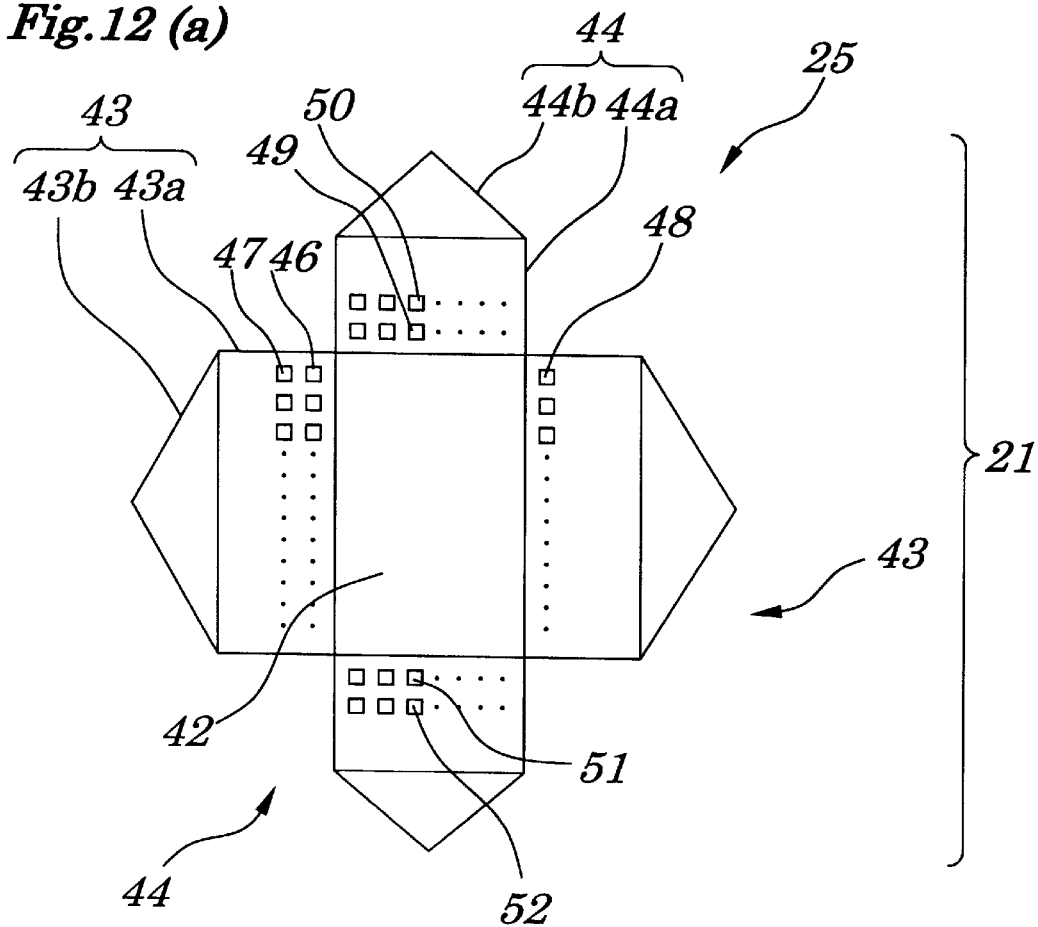
FIGS. 12(a) and 12(b) are respectively plan views of the wiring built-in insulation film still not folded and is used in the semiconductor device of the fifth embodiment of the present invention shown in FIG. 11, illustrating the order of process steps of the method for fabricating the semiconductor device.
Figure 12:
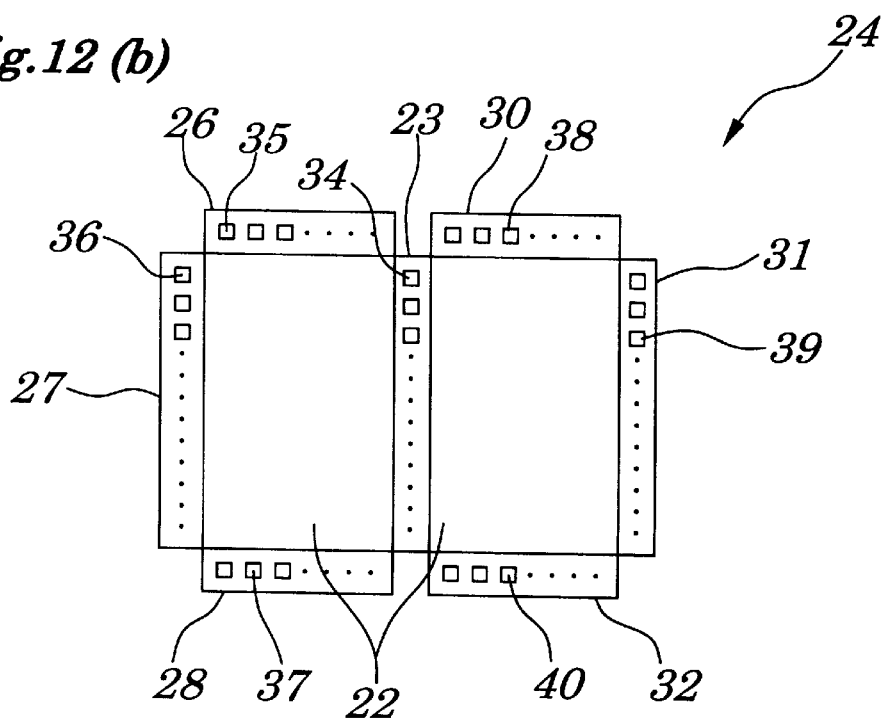

FIG. 11 is a cross-sectional view of the semiconductor device of a fifth embodiment of the present invention. FIGS. 12(a) and 12(b) are plan views of the wiring built-in insulation film used in the method of the present invention for fabricating the semiconductor device of the fifth embodiment of the present invention. This fifth embodiment of the present invention considerably differs from the first embodiment of the present invention in that it has its wiring built-in insulation film 21 constructed of a first and a second film.

In other words, as shown in FIGS. 12(a) and 12(b), in the fifth embodiment of the semiconductor device of the present invention, the wiring built-in insulation film 21 is constructed of: a first film 24 constructed of a pair of unit films 22 integrally connected with each other through an intermediate support portion 23, wherein each of the unit films 22 assumes an elongated shape and linearly arranged, each of the unit films 22 corresponding to each of the bare chips 2 (shown in FIG. 1); and, a second film 25 for covering the first film 24.

Formed in the peripheral regions of a left one of the unit films 22 of the first film 24 as viewed in FIGS. 12(a) and 12(b) are a plurality of side surface portions 26, 27 and 28. Similarly formed in the peripheral regions of a right one of the unit films 22 of the first film 24 as viewed in FIGS. 12(a) and 12(b) are a plurality of side surface portions 30, 31 and 32. Further, formed in the intermediate support portion 23 of the first film 24 are a plurality of the made-for-short-circuit electrodes 34 for reducing in impedance both the power supply and the signal lines of the semiconductor device. Similarly, provided in each of the side surface portions 26, 27 and 28 of the first film 24 are a plurality of the made-for-short-circuit electrodes 35, 36 and 37. Also provided in each of the side surface portions 30, 31 and 32 of the first film 24 are a plurality of the made-for-short-circuit electrodes 38, 39 and 40.

On the other hand, formed in a central portion of the second film 25 is a cover film 42 corresponding to the unit film 22. Further formed in the peripheral regions of the cover film 42 are a pair of fixing films 43 and a pair of fixing films 44. In addition, each of the fixing films 43 is provided with a chip support portion 43a and a chip sealing portion 43b; and, each of the fixing films 44 is provided with a chip support portion 44a and a chip sealing portion 44b.

Provided in one of the chip support portions 43a are a plurality of outgoing electrodes 46, 47 for the made-for-short-circuit electrodes 36, 39, wherein:

the made-for-short-circuit electrodes 36 are provided in the side surface portion 27 of the left one of the unit films 22, as viewed in FIGS. 12(a) and 12(b); the made-for-short circuit electrodes 39 are provided in the side surface portion 31 of the right one of the unit films 22, as viewed in FIGS. 12(a) and 12(b); and, the outgoing electrodes 46, 47 correspond to the made-for-short-circuit electrodes 36, 39. Further, provided in the other of the chip support portions 43a are a plurality of outgoing electrodes 48 for the made-for-short-circuit electrodes 34, wherein these made-for-short-circuit electrodes 34 are provided in the above-mentioned intermediate support portion 23 so as to correspond to their outgoing electrodes 48. On the other hand, provided in one of the chip support portions 44a are a plurality of outgoing electrodes 49, 50 for the made-for-short-circuit electrodes 35, 38, wherein:

the made-for-short-circuit electrodes 35 are provided in the side surface portion 26 of the left one of the unit films 22, as viewed in FIGS. 12(a) and 12(b); the made-for-short circuit electrodes 38 are provided in the side surface portion 30 of the right one of the unit films 22, as viewed in FIGS. 12(a) and 12(b); and, the outgoing electrodes 49, 50 correspond to these made-for-short-circuit electrodes 35, 38. Further, provided in the other of the chip support portions 44a are a plurality of outgoing electrodes 51, 52 for the made-for-short-circuit electrodes 37, 40, wherein:

the made-for-short-circuit electrodes 37 are provided in the side surface portion 28; the made-for-short-circuit electrodes 40 are provided in the side surface portion 32; and, the outgoing electrodes 51, 52 correspond to these made-for-short-circuit electrodes 37, 40.

Incidentally, though a bump-like electrode is formed in the second film 25 as an external electrode, such a bump-like electrode is omitted, and therefore not shown in the drawings.

Next, a method for fabricating the semiconductor device by using the first film 24 and the second film 25 both described in the above will be described.

In the first place, the bare chip 2 is mounted or packaged in each of the unit films of the first film 24 by the flip chip bonding process. After that, the unit films 22 is bent through an angle of approximately 180 degrees at the intermediate support portion 23 located between the pair of the unit films 22. Further, each of the side surface portions 26, 27, 28, 30, 31 and 32 of the unit films 22 is bent through an angle of approximately 90 degrees in the direction that encircles each of the bare chips 2 mounted in these unit films 22.

Subsequent to the above, the bare chip 2 is mounted on the cover film 42 of the second film 25 by the flip chip bonding process. After that, each of the chip support portions 43a, 44a is bent through an angle of approximately 90 degrees in the direction that encircles the bare chip 2 and covers the first film 24 from above. Then, each of the chip sealing portions 43b, 44b is bent through an angle of approximately 90 degrees and fixedly bonded to the bare chip 2 located in the lower layer, so that this fifth embodiment of the semiconductor device of the present invention is produced.

In the above construction, the made-for-short-circuit electrodes 30, 31, 32, 34, 35, 36, 37 of the first film 24 are therefore brought into electric contact with the corresponding outgoing electrodes 46, 47, 48, 49, 50, 51 and 52 of the second film 25. In other words, the made-for-short-circuit electrodes 36 and 39 of the first film 24 are brought into electric contact with the outgoing electrodes 46 and 47 of the second film 25, respectively. Similarly, the made-for-short-circuit electrode 34 is brought into electric contact with the outgoing electrode 48. Further, the made-for-short-circuit electrodes 35 and 38 are brought into electric contact with the outgoing electrodes 49 and 50, respectively. Similarly, the made-for-short-circuit electrodes 37 and 40 are brought into electric contact with the outgoing electrodes 51 and 52, respectively. As a result, the plurality of the made-for-short-circuit electrodes provided in the above construction for reducing in impedance each of the power supply and the signal lines of each of the bare chips 2 is accessible from the outside through the outgoing electrode for the made-for-short-circuit electrodes.

As is clear from the above, it is also possible for this fifth embodiment of the present invention to obtain substantially the same effect as that of the first embodiment of the present invention.

Further, in this fifth embodiment of the present invention, since a pair of the insulation films are combined with each other to produce the semiconductor device, it is possible for the present invention to expand design freedom in fabrication of the semiconductor device.

Sixth Embodiment

Figure 13:
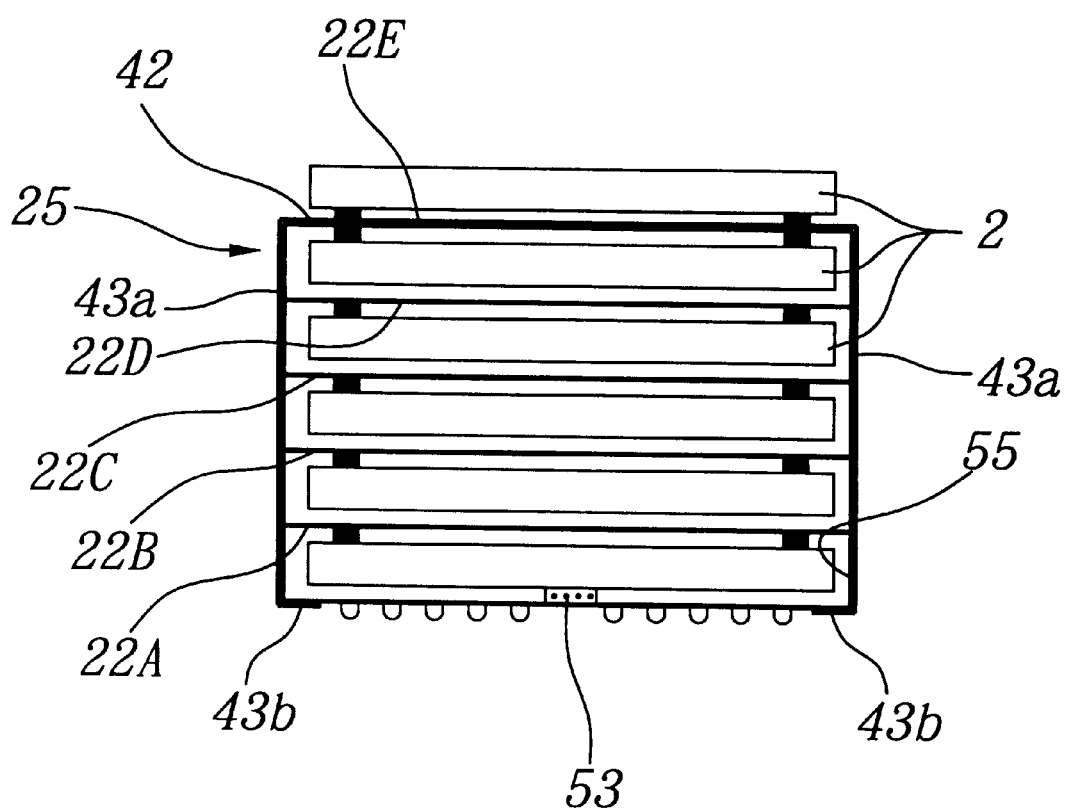
FIG. 13 is a cross-sectional view of the semiconductor device of a sixth embodiment of the present invention.

FIG. 13 is a cross-sectional view of the semiconductor device of a sixth embodiment of the present invention.

Figure 14:
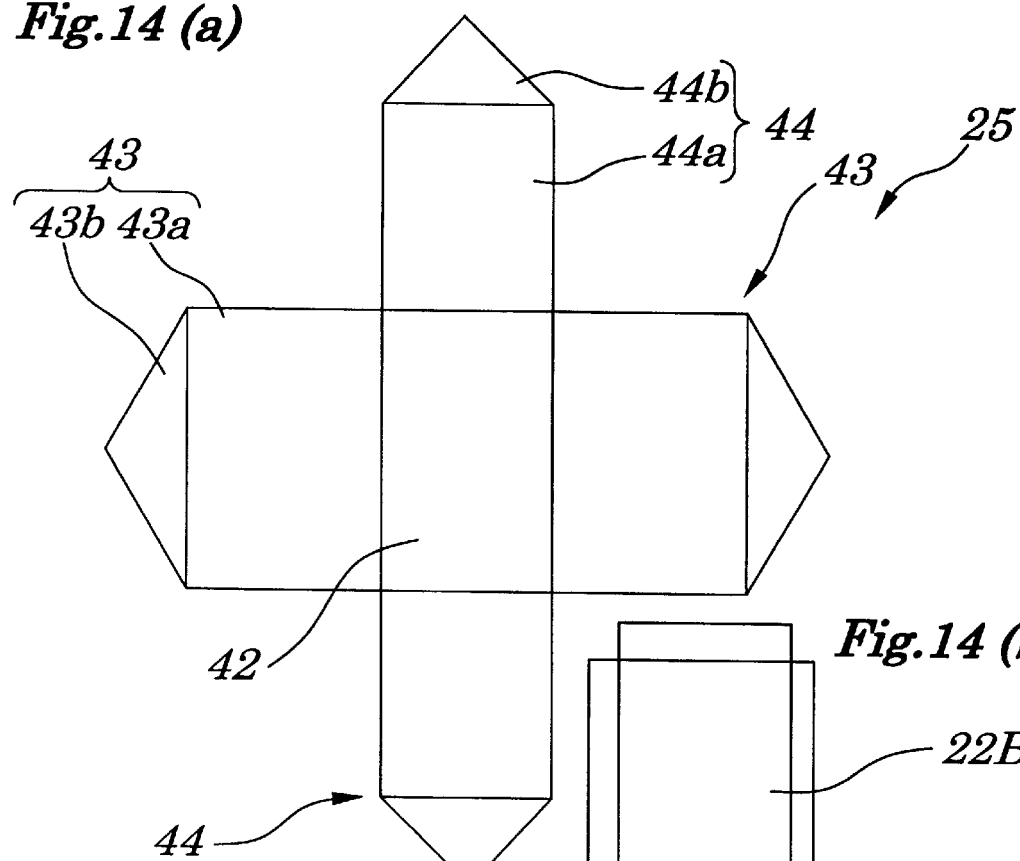
FIGS. 14(a) and 14(b) are respectively plan views of the wiring built-in insulation film still not folded and is used in the semiconductor device of the sixth embodiment of the present invention shown in FIG. 13, illustrating the order of process steps of the method for fabricating the semiconductor device.
Figure 14:
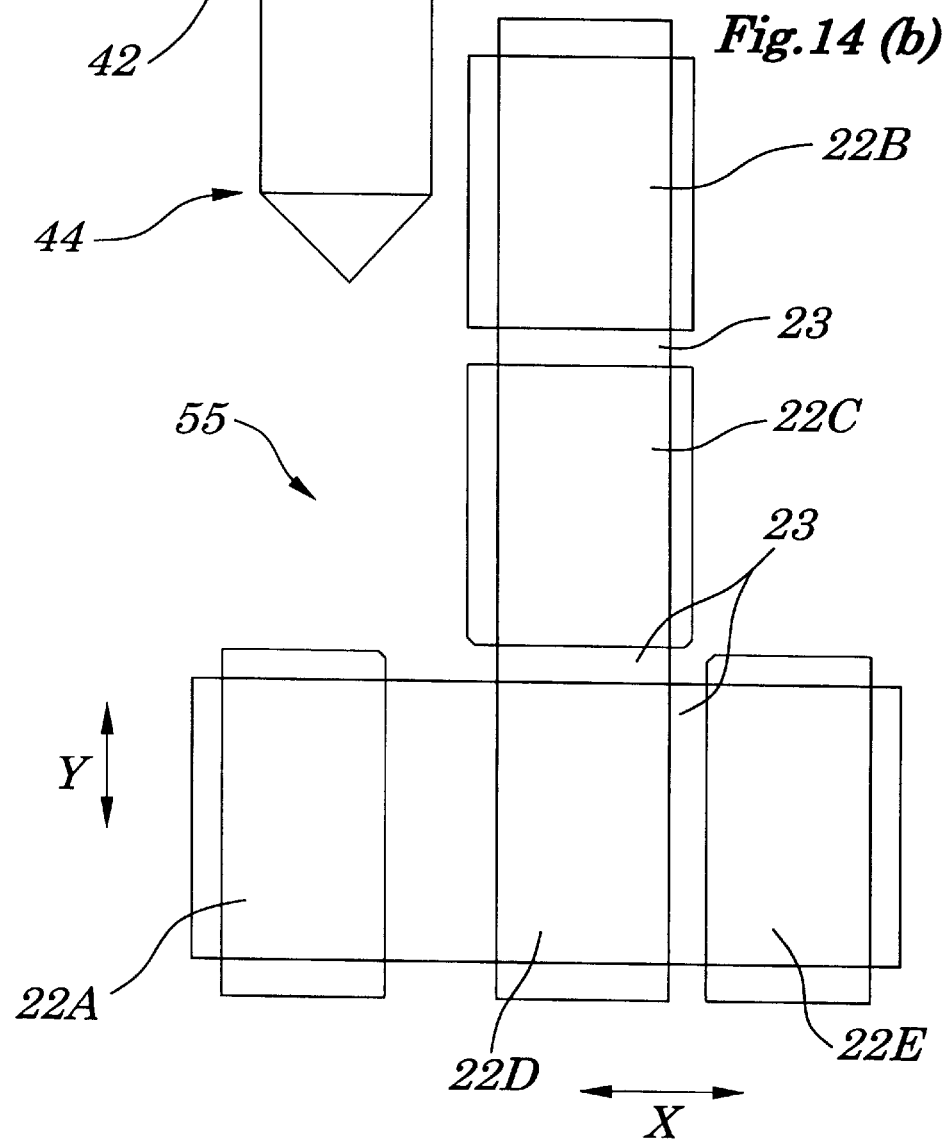

FIGS. 14(a) and 14(b) are plan views of the wiring built-in insulation film used in the method of the present invention for fabricating the semiconductor device shown in FIG. 13. This sixth embodiment of the present invention considerably differs from the fifth embodiment of the present invention in that it has its unit films 22A, 22B, 22C, 22D and 22E of a first film 55 arranged in two-dimensional directions.

In other words, as shown in FIGS. 14(a) and 14(b), in the sixth embodiment of the semiconductor device of the present invention:

formed in the first film 55 are a series of, for example, three pieces of unit films 22A, 22D and 22E which are spaced apart from each other and aligned in a row in a direction X; and, also formed in the first film 55 are a series of, for example, two pieces of unit films 22C and 22B which are spaced apart from each other and aligned in a row in a direction Y. In this way, the first film 55 has its unit films 22A, 22B, 22C, 22D and 22E arranged in the so-called two-dimensional directions.

Next, a method for fabricating the semiconductor device of this sixth embodiment of the present invention by using the first film 55 having the above construction will be described.

In the first place, the bare chip 2 is mounted or packaged in each of the unit films 22A, 22B, 22C, 22D and 22E of the first film 55 by the flip chip bonding process. After that, the unit film 22E is bent through an angle of approximately 180 degrees at the intermediate support portion 23 so as to be disposed in overlapping relation with the unit film 22D. Subsequent to the unit film 22E, the remaining unit films 22C, 22B and 22A are sequentially bent in a manner substantially similar to the above unit film 22E so as to be disposed under the unit films 22D, 22C and 22B, respectively. Then, the base chip 2 is packaged in the cover film 42 of the second film 25 by the flip chip bonding process. After that, each of the chip support portions 43a, 44a shown in FIGS. 14(a) and 14(b) is bent through an angle of approximately 90 degrees in the direction that encircles the bare chip 2 and covers the first film 55 from above. Then, each of the chip sealing portions 43b, 44b is bent through an angle of approximately 90 degrees and fixedly bonded by means of an insulating resin 53 to the bare chip 2 located in the lower layer, so that this sixth embodiment of the semiconductor device of the present invention is produced.

As is clear from the above, it is also possible for this sixth embodiment of the present invention to obtain substantially the same effect as that of the fifth embodiment of the present invention.

Further, in this sixth embodiment of the present invention, since the wiring built-in insulation film 21, which is used in this sixth embodiment of the present invention and constructed of the first film 55 and the second film 25, has the unit films 22A, 22B, 22C, 22D and 22E of the first film 55 arranged in two-dimensional directions and used in packaging the bare chips 2 therein, it is possible to have its components be compact in size.

Seventh Embodiment

Figure 15:
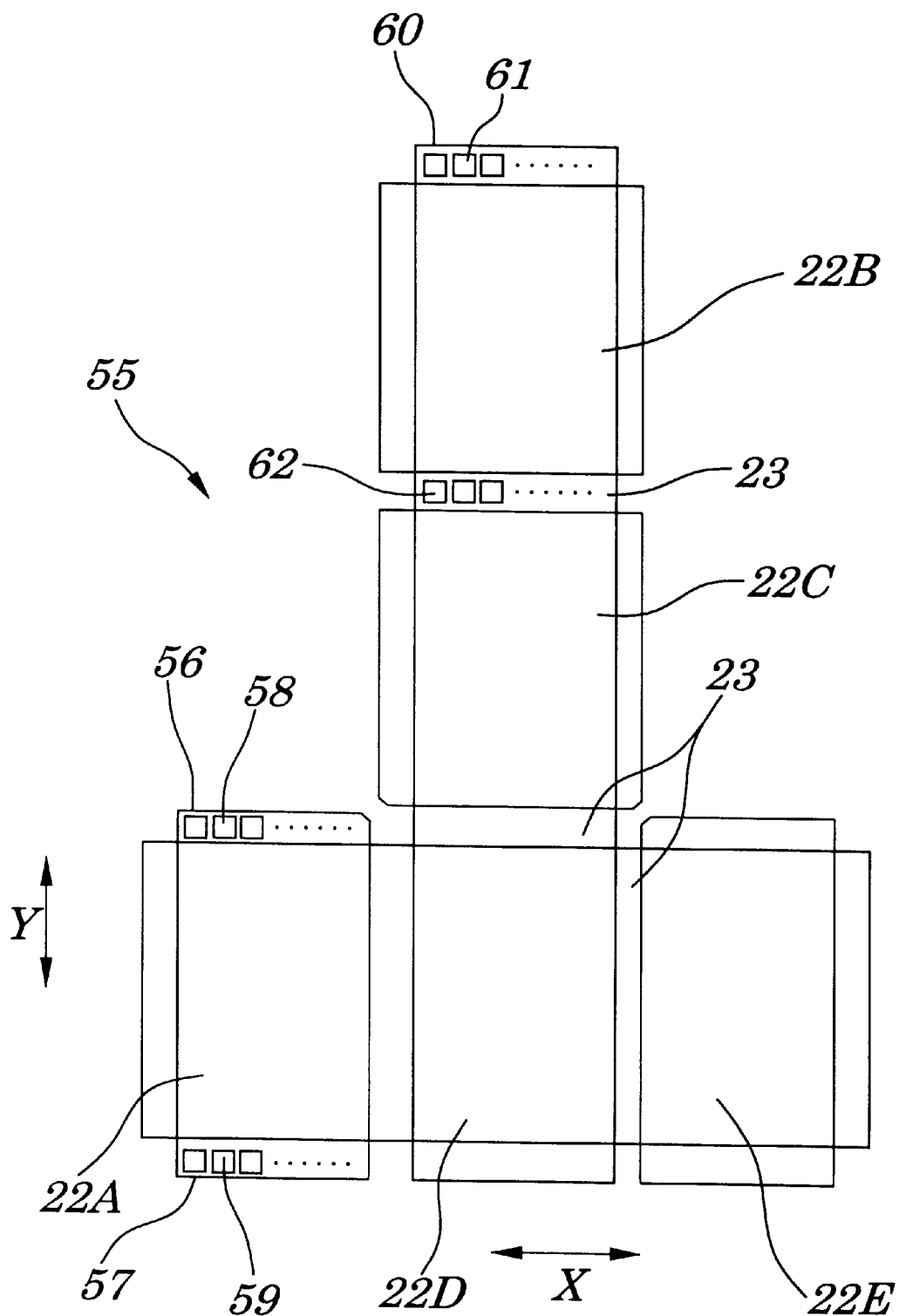
FIG. 15 is a plan view of the first film forming the wiring built-in insulation film still not folded and is used in the semiconductor device of a seventh embodiment of the present invention.

FIG. 15 is a plan view of the wiring built-in insulation film used in the semiconductor device of a seventh embodiment of the present invention. This seventh embodiment of the present invention considerably differs from the sixth embodiment of the present invention in that it has each of its unit films 22A, 22B, 22C, 22D and 22E provided with a plurality of made-for-short-circuit electrodes 58, 59, 61 and 62 in the peripheral regions of these unit films so as to reduce in impedance both the power supply and the signal lines of the semiconductor device.

More specifically, as shown in FIG. 15, in the seventh embodiment of the semiconductor device of the present invention, for example:

formed in opposite side surface portions 56 and 57 of the unit films 22A oppositely disposed from each other in the direction Y are the made-for-short-circuit electrodes 58 and 59, respectively, the side surface portions 56, 57 being brought into electric contact with each other when the first film 55 is bent; and, formed in a side surface portion 60 and the intermediate support portion 23 of the unit film 22B corresponding to the unit film 22A are the made-for-short-circuit electrodes 61 and 62, respectively.

Due to the above construction, when the first film 55 is bent to fabricate the semiconductor device of the seventh embodiment of the present invention, the made-for-short-circuit electrodes 58 of the unit film 22A are brought into electric contact with the made-for-short-circuit electrodes 61 of the corresponding unit film 22B, and the made-for-short-circuit electrodes 59 of the unit film 22A are brought into electric contact with the corresponding made-for-short-circuit electrodes 62. Consequently, in this seventh embodiment of the present invention, without increasing its two-dimensional packaging space, these made-for-short-circuit electrodes 58, 59, 61 and 62 for reducing in impedance both the power supply and the signal lines of the semiconductor device are capable of being brought into electric contact with external electrodes.

As described above, it is also possible for this seventh embodiment of the present invention to obtain substantially the same effect as that of the sixth embodiment of the present invention.

Further, in this seventh embodiment of the present invention, it is possible to provide the made-for-short-circuit electrodes for reducing in impedance both the power supply and the signal lines of the semiconductor device, without increasing the two-dimensional packaging space of the semiconductor device.

Eighth Embodiment

Figure 16:
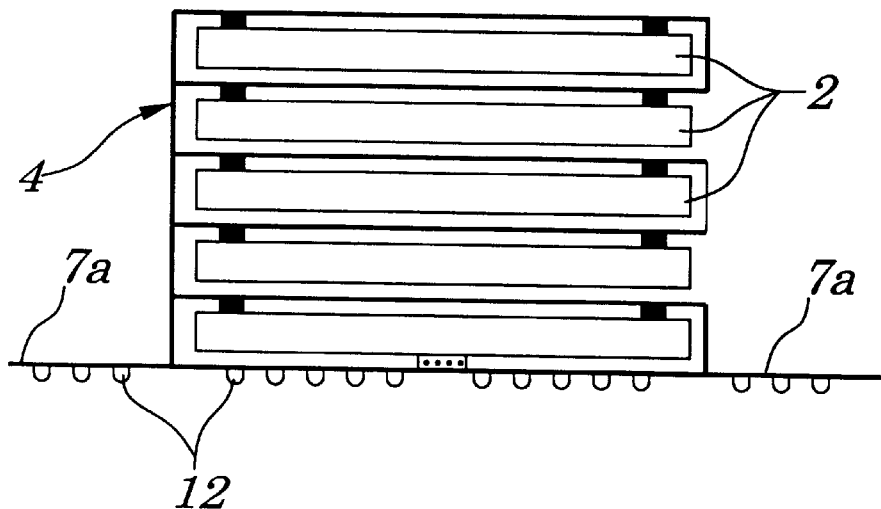
FIG. 16 is a cross-sectional view of the semiconductor device of an eighth embodiment of the present invention.

FIG. 16 is a cross-sectional view of the semiconductor device of an eighth embodiment of the present invention. The semiconductor device of this eighth embodiment of the present invention has a construction which fulfills the need for increasing the number of external electrodes.

In this eighth embodiment of the present invention, for example, the chip support portion 7a of the fixing film 7 in the wiring built-in insulation film 4 used in the first embodiment of the present invention is partially extended outwardly. More specifically, by previously forming a plurality of the bump-like electrodes 12 in this chip support portion 7a, the number of the external electrodes is increased in the semiconductor device of the eighth embodiment of the present invention.

As described above, in this eighth embodiment of the present invention, when the semiconductor device is constructed of the bare chips having been stacked together, it is possible to increase the number of the external electrodes.

Ninth Embodiment

Figure 17:
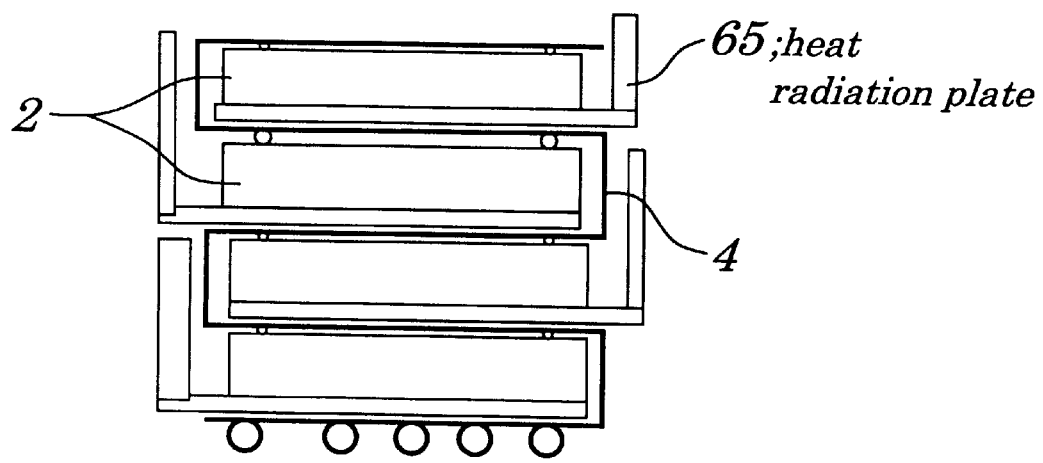
FIG. 17 is a cross-sectional view of the semiconductor device of a ninth embodiment of the present invention.
Figure 18:
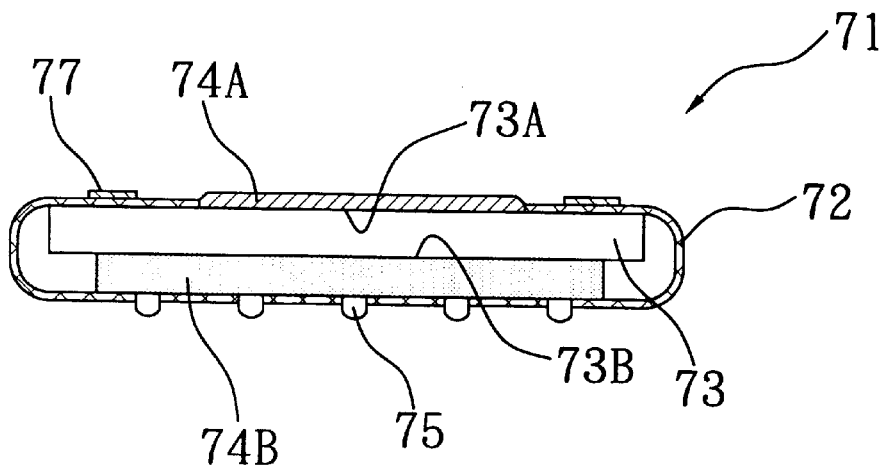
FIG. 18 is a cross-sectional view of one type of the conventional semiconductor devices.
Figure 19:
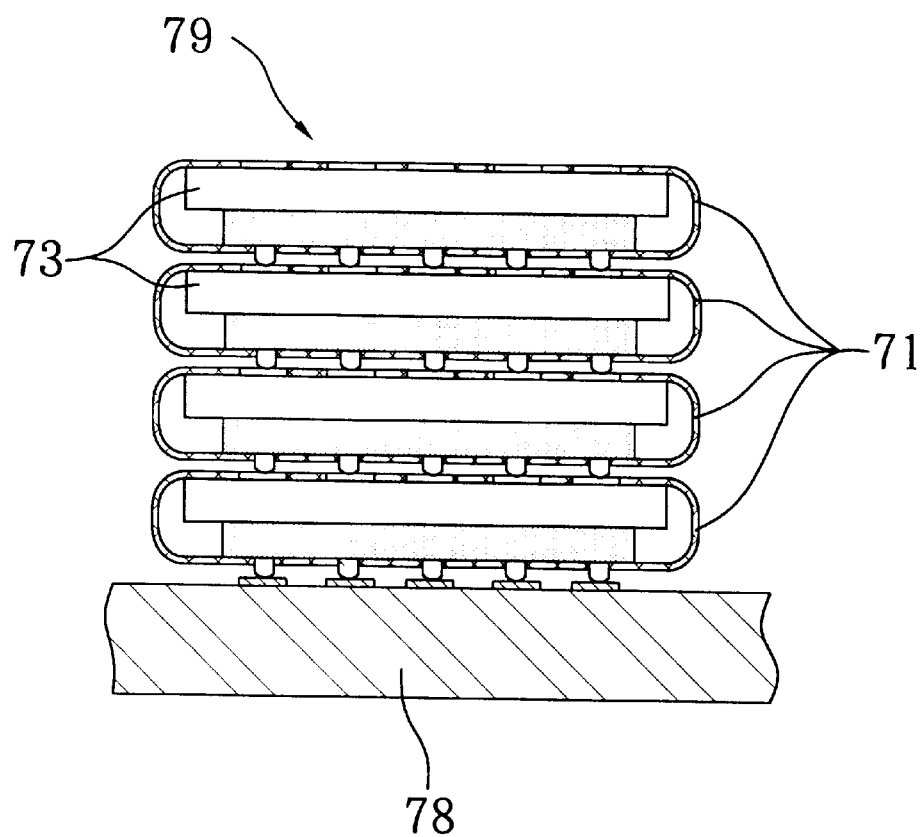
FIG. 19 is a cross-sectional view of another type of the conventional semiconductor devices.

FIG. 17 is a cross-sectional view of the semiconductor device of a ninth embodiment of the present invention. The semiconductor device of this ninth embodiment of the present invention has a construction which fulfills the need for improving he semiconductor device in its heat radiation properties.

In this ninth embodiment of the present invention, a heat radiation plate (i.e., heat sink) 65 is interposed between adjacent ones of the bare chips 2 of the semiconductor device. This heat radiation plate 65 is constructed of a thin plate made of a suitable material such as aluminum, copper and like materials excellent in heat radiation properties, and bonded between the bare chip 2 and the wiring built-in insulation film 4 by means of a suitable insulating resin.

As described above, in this ninth embodiment of the present invention, when the semiconductor device is constructed of the bare chips having been stacked together, it is possible to improve the semiconductor in its heat radiation properties, without considerably increasing the two-dimensional packaging space of the semiconductor device.

Although the embodiments of the present invention have been described in the above, a concrete construction of the present invention is not limited to these embodiments only. For example, it is also possible to increase or decrease the number of the unit films, as required, provided that these unit films form the wiring built-in insulation film.

Further, as for the bump-like electrodes formed outside the wiring built-in insulation film, it is also possible to form these bump-like electrodes inside the wiring built-in insulation film in which the pad electrodes are connected. As for the made-for-short-circuit electrodes, they may be constructed of the bump-like electrodes.

Further, as for the area size of each of the plurality of the unit films in which the bare chip is mounted or packaged, it may be changed so as to meet the size of the bare chip being mounted therein.

Further, as for articles to be mounted or packaged in the wiring built-in insulation film, they are not limited to electronic components only. In other words, these articles may be any other components such as heat insulation plates (i.e., heat sinks) and the like.

It is thus apparent that the present invention is not limited to the above embodiments but may be changed and modified without departing from the scope and spirit of the invention.

Finally, the present application claims the priority of Japanese Patent Application No. Hei10-177445 filed on Jun. 24, 1998, which is herein incorporated by reference.

What is claimed is:

1. In a semiconductor device having a plurality of its bare chips each with a pad electrode wrapped up in a wiring built-in insulation film with a plurality of external electrodes corresponding to said pad electrodes in a manner such that said pad electrodes of said bare chips are brought into electric contact with said external electrodes of said wiring built-in insulation film, the improvement wherein:

said wiring built-in insulation film assumes a linearly elongated shape containing a series of linearly arranged unit films in each of which each of said bare chips is packaged;

said wiring built-in insulation film is bent through an angle of approximately 180 degrees at every unit film alternately to the right and the left in a zigzag manner;

each of said bare chips is packaged in each of said unit films of said wiring built-in insulation film;

a plurality of said bare chips, which are packaged in said unit films of said wiring built-in insulation film thus bent in the zigzag manner, are then stacked together in the direction of thickness dimensions of said chips; and an end portion of said wiring built-in insulation film is fixed to the lowermost one of the thus stacked bare chips so as to wrap all said bare chips up in said wiring built-in insulation film.

2. A semiconductor device according to claim 1, wherein said wiring built-in insulation film is constructed of a series of said unit films linearly arranged.

3. A semiconductor device according to claim 1, wherein a made-for-short-circuit electrode is provided in a peripheral region of each of said unit films, and said made-for-short-circuit electrode of said unit film is capable of being brought into electric contact with an external electrode through an outer film disposed adjacent to said unit film.

4. A semiconductor device according to claim 2, wherein a made-for-short-circuit electrode is provided in a peripheral region of each of said unit films, and said made-for-short-circuit electrode of said unit film is capable of being brought into electric contact with an external electrode through an outer film disposed adjacent to said unit film.

5. A semiconductor device according to claim 3, wherein said bare chip is packaged in said second film.

6. A semiconductor device according to claim 4, wherein said bare chip is packaged in said second film.

7. In a semiconductor device having a plurality of its bare chips each with a pad electrode wrapped up in a wiring built-in insulation film with a plurality of external electrodes corresponding to said pad electrodes in a manner such that said pad electrodes of said bare chips are brought into electric contact with said external electrodes of said wiring built-in insulation film, the improvement wherein:

said wiring built-in insulation film is constructed of a first film and a second film;

said first film assumes a linearly elongated shape containing a series of linearly arranged unit films in each of which each of said bare chips is packaged;

said second film covers said first film;

said first film is bent through an angle of approximately 180 degrees at every unit film;

each of said bare chips is packaged in each of said unit films of said wiring built-in insulation film;

a plurality of said bare chips, which are packaged in said unit films of said first film thus bent, are then stacked together in the direction of thickness dimensions of said bare chips; and an end portion of said second film is fixed to the lowermost one of the thus stacked bare chips so as to wrap all said bare chips up in said wiring built-in insulation film.

8. A semiconductor device according to claim 7, wherein said first film continuously extends in two-dimensional directions.

9. A semiconductor device according to claim 7, wherein a made-for-short-circuit electrode is provided in a peripheral region of each of said unit films, and said made-for-short-circuit electrode of said unit film is capable of being brought into electric contact with an external electrode through an outer film disposed adjacent to said unit film.

10. A semiconductor device according to claim 8, wherein a made-for-short-circuit electrode is provided in a peripheral region of each of said unit films, and said made-for-short-circuit electrode of said unit film is capable of being brought into electric contact with an external electrode through an outer film disposed adjacent to said unit film.

11. A semiconductor device according to claim 7, wherein said bare chip is packaged in said second film.

12. A semiconductor device according to claim 8, wherein said bare chip is packaged in said second film.

13. A semiconductor device according to claim 9, wherein said bare chip is packaged in said second film.

14. A semiconductor device according to claim 10, wherein said bare chip is packaged in said second film.

* * * * *